(12) United States Patent
Marty et al.

(10) Patent No.: US 6,316,818 B1
(45) Date of Patent: Nov. 13, 2001

(54) VERTICAL BIPOLAR TRANSISTOR INCLUDING AN EXTRINSIC BASE WITH REDUCED ROUGHNESS, AND FABRICATION PROCESS

(75) Inventors: Michel Marty, St. Paul de Varces; Alain Chantre, Seyssins; Jorge Regolini, Bernin, all of (FR)

(73) Assignees: STMicroelectronics S.A., Gentilly; Commissariat a l'Energie Atomique, Paris, both of (FR)

( * ) Notice: Subject to any disclaimer, the term of this patent is extended or adjusted under 35 U.S.C. 154(b) by 0 days.

(21) Appl. No.: 09/323,357

(22) Filed: Jun. 1, 1999

(30) Foreign Application Priority Data

Jun. 5, 1998 (FR) .................................................. 98 07061

(51) Int. Cl.[7] .............................................. H01L 21/3205
(52) U.S. Cl. .......................... 257/592; 257/197; 257/200; 257/588
(58) Field of Search ..................................... 257/592, 591, 257/198, 526, 197, 588, 586, 587, 200

(56) References Cited

U.S. PATENT DOCUMENTS

| 4,504,332 | 3/1985 | Shinada | ............................... 148/187 |
| 5,024,957 | * 6/1991 | Harame et al. | ............... 148/DIG. 11 |
| 5,132,765 | * 7/1992 | Blouse et al. | ........................... 357/34 |
| 5,323,057 | * 6/1994 | Cook et al. | ........................... 257/591 |
| 5,500,554 | 3/1996 | Sato | ..................................... 257/588 |
| 5,656,514 | * 8/1997 | Ahlgren | ................................ 438/320 |
| 5,834,800 | * 11/1998 | Jalali-Farahani et al. | ........... 257/198 |

FOREIGN PATENT DOCUMENTS

| 0 296 925 A 1 | 12/1988 | (EP) . |
| 0 779 664 A 2 | 6/1997 | (EP) . |
| 0 843 354 A 1 | 5/1998 | (EP) . |

* cited by examiner

Primary Examiner—Michael Trinh
(74) Attorney, Agent, or Firm—Lisa K. Jorgenson; Allen, Dyer, Doppelt, Milbrath & Gilchrist, P.A.

(57) ABSTRACT

The vertical bipolar transistor includes an SiGe heterojunction base formed by a stack of layers of silicon and silicon-germanium resting on an initial layer of silicon nitride extending over a side insulation region surrounding the upper part of the intrinsic collector. The stack of layers also extends on the surface of the intrinsic collector which lies inside a window formed in the initial layer of silicon nitride.

3 Claims, 2 Drawing Sheets

VERTICAL BIPOLAR TRANSISTOR INCLUDING AN EXTRINSIC BASE WITH REDUCED ROUGHNESS, AND FABRICATION PROCESS

RELATED APPLICATION

This application is related to: copending application entitled "METHOD OF SELECTIVELY DOPING THE INTRINSIC COLLECTOR OF A VERTICAL BIPOLAR TRANSISTOR WITH EPITAXIAL BASE", U.S. application Ser. No. 09/323,525 filed on Jun. 1, 1999, pending; and copending application entitled "LOW-NOISE VERTICAL BIPOLAR TRANSISTOR AND CORRESPONDING FABRICATION PROCESS", U.S. application Ser. No. No. 09/323,418 filed on Jun. 1, 1999, U.S. Pat. No. 6,177,717, which were concurrently filed with the present application.

FIELD OF THE INVENTION

The invention relates to vertical bipolar transistors, in particular, those intended to be integrated in high-frequency technologies with very large scale integration (VLSI). Furthermore, the invention relates to the characteristics and the production of the epitaxial bases of these transistors.

BACKGROUND OF THE INVENTION

In the related patent application, filed by the applicant on the same day as the present patent application, and entitled "LOW-NOISE VERTICAL BIPOLAR TRANSISTOR AND CORRESPONDING FABRICATION PROCESS", U.S. Patent Application Ser. No. 09/323,418 filed on Jun. 1, 1999, U.S. Pat. No. 6,177,717, a method is described for producing a vertical bipolar transistor with a silicon/germanium heterojunction base and epitaxial emitter on the upper surface of this base. As described in this patent application, the production of the base includes nonselective epitaxy of a stack of layers of silicon and silicon-germanium in a window, referred to as the "base window", made on the surface of the intrinsic collector, as well as on the two parts of an amorphous-silicon protective layer which are arranged on sides of the base window.

Before carrying out this nonselective epitaxy, chemical deoxidation of the base window is carried out, followed by a treatment under hydrogen at a temperature in excess of 600° C. for desorbing the residual components which may remain following the chemical deoxidation. However, during this desorption treatment the amorphous silicon converts into polysilicon, which leads to larger grains being obtained. This finally results in an increase in the roughness of the upper surface of the stack of epitaxial layers within which the base will be produced, which may be a problem in certain applications. This is because excessive roughness may pose problems in aligning the emitter window, as well as for the photolithography phases of the subsequent layers.

Furthermore, an excessive level difference between the peaks and troughs formed on the upper surface of the base may lead to implantation non-uniformities of the extrinsic base as well as to a silicide, deposited on the base, which is rougher and therefore more resistive. Consequently, this leads to an increase in the base-access resistance.

SUMMARY OF THE INVENTION

The object of the invention is, in particular, to reduce the roughness of the extrinsic base of these transistors, as well as the base-access resistance.

The invention therefore provides a method of producing an SiGe heterojunction base of a vertical bipolar transistor, comprising the formation, on a semiconductor block including an intrinsic collector region (for example, epitaxial or implanted) surrounded in its upper part by a side insulation region, of an initial layer of silicon nitride forming a window (base window) above the surface of the intrinsic collector. The production of the base then includes nonselective epitaxy of a stack of layers of silicon and silicon-germanium on that surface of the collector lying in the window and on the initial layer of silicon nitride.

In other words, the amorphous silicon layer is replaced by a silicon nitride layer and the epitaxy of the base begins directly on the nitride. This results in a significant reduction in the roughness of the upper surface of the base stack, and in certain cases resulting in the peak/trough level difference on the surface of the extrinsic base being reduced by half. Furthermore, whereas the amorphous silicon layer has been used to provide a uniform silicon substrate at the start of epitaxy so as to obtain better thickness uniformity in the deposition of the base, it has been observed that the silicon nitride layer also makes it possible to obtain good thickness uniformity of the base above the intrinsic collector and above the silicon nitride layer.

The invention also relates to a vertical bipolar transistor comprising a silicon-germanium heterojunction base formed in a stack of layers of silicon and silicon-germanium resting on an initial layer of silicon nitride extending over the side insulation region surrounding the upper part of the intrinsic collector, as well as on that surface of the intrinsic collector which lies inside a window formed in the initial layer of silicon nitride.

BRIEF DESCRIPTION OF THE DRAWINGS

Other advantages and characteristics of the invention will become apparent on examining the detailed description of an embodiment and mode of production which implies no limitation, and the appended drawings in which.

DETAILED DESCRIPTION OF THE PREFERRED EMBODIMENTS

Figure 1:
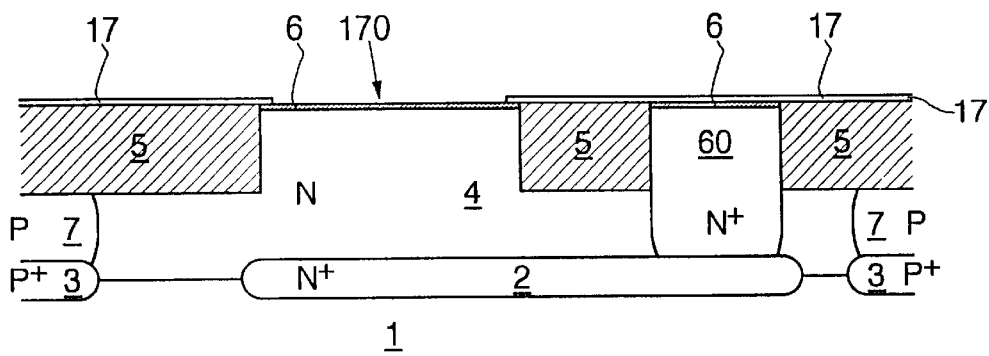
FIGS. 1 to 6 schematically illustrate an embodiment of the method according to the invention, resulting in an embodiment of a transistor according to the invention.

In FIG. 1, reference 1 denotes a silicon substrate, for example of the P type, on the surface of which an N+ doped extrinsic collector buried layer 2 is produced in a way which is conventional, e.g. by arsenic implantation. Similarly, two P+ doped buried layers 3 are produced in the conventional way on either side of the extrinsic collector 2, e.g. by boron implantation. Thick epitaxy is carried out on the substrate 1 thus formed so as to produce an N type monocrystalline silicon layer 4 having a thickness typically of the order of 1 micron. A side insulation region 5 is then produced in this layer 4 in a way which is known, either by a local oxidation (or LOCOS) method or a shallow trench type method. For the sake of simplicity, FIG. 1 represents a side insulation region 5 of the shallow trench type.

An N+ doped collector well 60 making contact with the buried layer 2 is also produced in the conventional way, in particular by phosphorus implantation. Boron implantations are then carried out so as to produce P doped well areas 7 under the side insulation region 5, allowing insulation from the transistors adjacent to the bipolar transistor being described here. A thermal oxide, typically silicon dioxide, is then grown in the conventional way on the surface of the epitaxial monocrystalline intrinsic collector 4. This growth of silicon dioxide also takes place over the entire wafer, and in particular on the collector well 60. This oxide also forms the gate oxide for complementary field-effect transistors with insulated gates (CMOS transistors) produced in conjunction with the bipolar transistor on the same wafer (BiCMOS technology also bipolar CMOS).

A layer 17, formed by silicon nitride ($Si_3N_4$) and having a thickness of 300 Å, is then deposited on the semiconductor unit thus formed. The deposition is chemical vapor deposition (CVD) using a gas mixture containing a silicon precursor and a nitrogen precursor. Next, by plasma etching with termination on the oxide layer 6, a window 170 referred to as the "base window" is etched. In the case wherein side insulation of the shallow trench type is used, the two parts of the etched silicon nitride layer 17 protrude slightly above the intrinsic collector 4. In the case wherein side insulation of the LOCOS type is used, the etching window 170 may be wider than the intrinsic collector 4.

Figure 2:
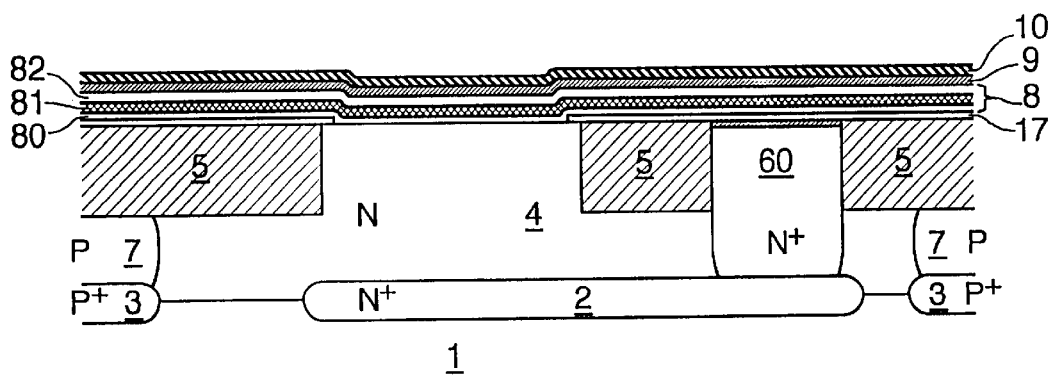

Next (FIG. 2), chemical deoxidation of the oxide layer 6 lying above the collector is carried out. It should be noted here that one of the functions of the silicon nitride layer 17 is to protect the rest of the wafer during this chemical deoxidation, and in particular, the side insulation zones when they are formed by shallow trenches. Next, following a treatment involving the desorption of the base window under hydrogen at a temperature in excess of 600° C., a stack 8 of three layers 80, 81 and 82, within which the future base of the transistor will be produced, is then epitaxially grown. More precisely, a first layer of undoped silicon 80 is epitaxially grown over a thickness of a few tens of nanometers. The second layer 81, formed by silicon/germanium, is then grown epitaxially. It is formed by a first sublayer of $Si_{1-x}Ge_x$, with x for example a constant lying between 0.1 and 0.2, on top of which there is a second sublayer, also formed by an $Si_{1-x}Ge_x$ alloy (with x decreasing to 0) and P doped with boron. The total thickness of the layer 81 is moderate, typically from 20 to 100 nm. An epitaxial layer 82, having a thickness of a few tens of nanometers and made of silicon P doped using boron, is then placed on top of the second sublayer of the layer 81.

At the end of this epitaxy, typically carried out at 700° C. in an ultraclean CVD reactor, a stack of monocrystalline layers is then obtained on the intrinsic collector in the base window, and polycrystalline layers above the silicon nitride layers 17. This stack of layers will make it possible to form a silicon/germanium heterojunction base. It should be noted here that the epitaxy for producing the heterojunction base is nonselective epitaxy. This silicon nitride layer also makes it possible to obtain good thickness uniformity of the epitaxial deposition of the base. It also makes it possible to obtain a peak/trough level difference on the surface of the stack on the order of 500 to 600 Å (whereas this level difference is on the order of 1000 Å with an initial layer of amorphous silicon).

Figure 3:
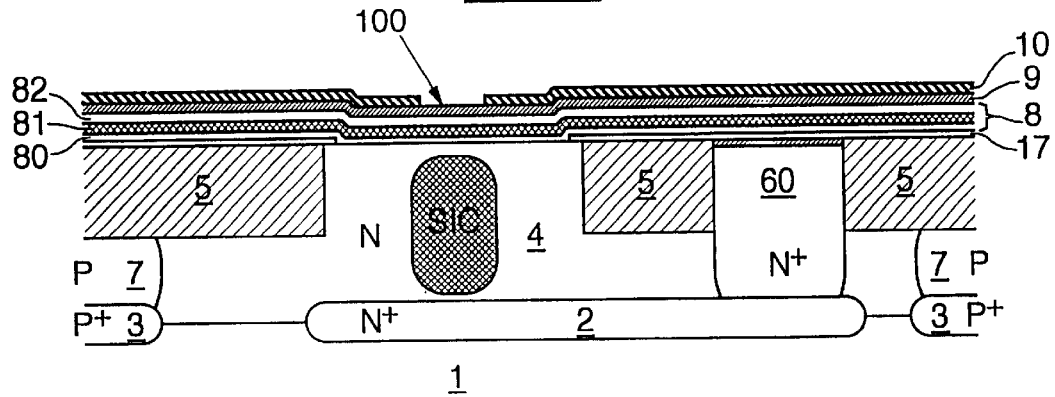

Next, a first layer 9 of silicon dioxide having a thickness on the order of 200 Å is deposited on the layer 81. A second layer 10 of silicon nitride ($Si_3N_4$) having a thickness of 300 Å is also deposited on the first silicon dioxide layer 9. Next (FIG. 3), a zone 100 in the nitride layer 10 corresponding to an emitter window lying above the intrinsic collector 4 is defined with the aid of a mask. Plasma etching of the nitride layer 10 with termination on the silicon dioxide layer 9 is then carried out in the conventional way, with the aid of a resin layer corresponding to the mask, so as to expose the zone 100. Next, keeping the resin which is present on the layer 10 and has been used in etching the layer 10, implantation of phosphorus is carried out through the stack. Selective overdoping of the collector (selective implantation collector) under the window of the emitter can be carried out in one or more implantation steps, thus contributing to an increase in the speed of the transistor by reducing the resistance of the collector. An overdoped SIC zone is therefore obtained under the emitter window.

Figure 4:
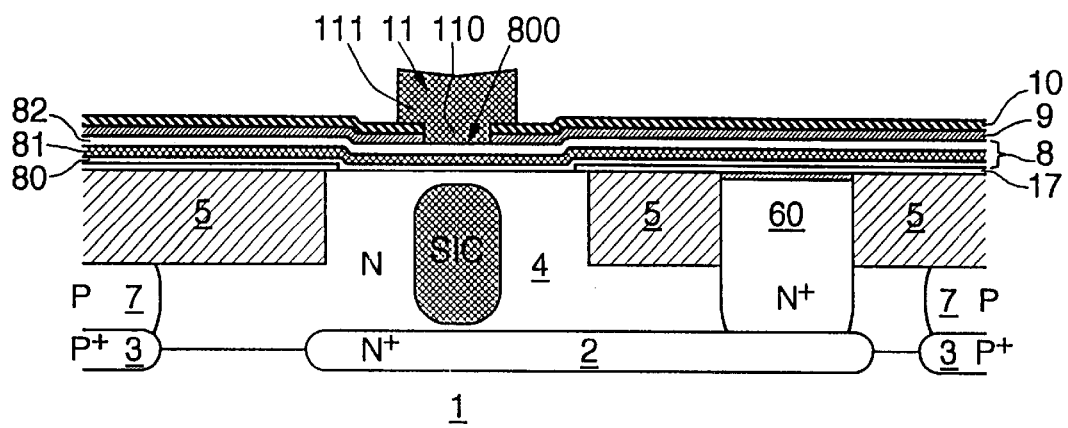

At the end of this step, the resin present on the silicon nitride layer 10 is removed and a chemical deoxidation treatment is carried out so as to remove the part of the silicon dioxide layer 9 lying in the zone 100 and thus to produce the emitter window 800 (FIG. 4). An example of such a chemical deoxidation treatment includes using an acid bath based on hydrofluoric acid diluted to about 1% for one minute. This makes it possible to obtain a monocrystalline silicon surface which is chemically clean. In other words, one on which the concentration of oxygen atoms is less than $10^{15}/cm^3$. Furthermore, such chemical deoxidation does not degrade the underlying monocrystalline silicon surface (unlike plasma etching, for example) and consequently does not introduce crystal defects. In order to further enhance the surface condition of the silicon, a desorption treatment under hydrogen at high temperature (>550° C.) is advantageously carried out so as to eliminate the residual impurities adsorbed on the surface of the silicon during the deoxidation.

Next, in an ultraclean CVD reactor, for example, the one marketed by Applied Materials under the reference CENTURA HTF, the emitter of the transistor is produced. More precisely, the semiconductor unit, with the base uncovered in the emitter window 800, is exposed to a silane and arsine gas mixture, in a non-oxidizing atmosphere, typically under vacuum or under hydrogen. The CVD conditions are, for example, a flow rate equal to 10 liters of hydrogen/min, a flow rate equal to 0.5 liter of silane/min and a flow rate equal to 0.12 $cm^3$ of arsine/min, at 630° C. and under a pressure of 80 torr. The person skilled in the art will have noted that these conditions actually correspond to polysilicon deposition. However, because of the chemically clean nature of the monocrystalline surface of the base uncovered in the window 800, the silicon deposited in this reactor grows epitaxially, in other words, it is grown in monocrystalline form on the base.

After a silicon layer having a thickness on the order of 2500 Å has been obtained, etching of the silicon layer is carried out, in the conventional way, by using a new photolithography mask as well as a corresponding photoresist, so as to obtain (FIG. 4) an emitter 11 which, in the window 800, has a lower part 110 on top of which there is an upper part 111 wider than the emitter window. The distance between the edge of the emitter window and the edge of the region 111 typically is on the order of 0.2 $\mu$m. This emitter has therefore been doped in situ and is monocrystalline, at least in the vicinity of the interface with the base in the emitter window.

Figure 5:
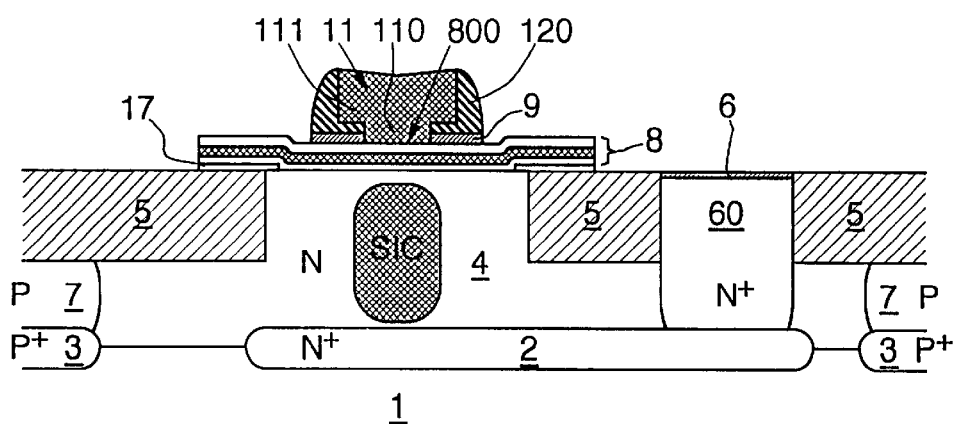
Figure 6:
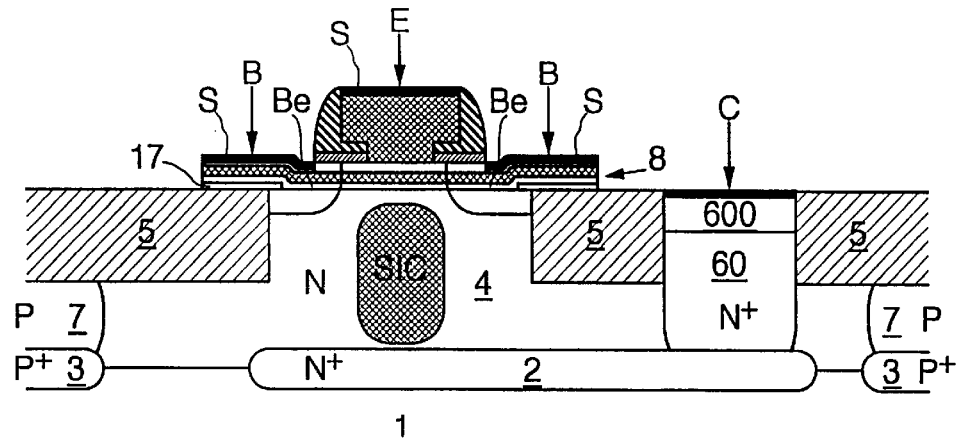

Deposition of a silicon nitride layer is then carried out, and this is etched so as to obtain spacers 120 which include the silicon nitride layer 10 and bear on the vertical walls of the upper region 111 of the emitter and on the silicon dioxide layer 9 (FIG. 5). The geometry of the base of the transistor is then defined with the aid of a new mask, and, after the oxide layer 9 has been etched, etching of the stack of layers 8 is carried out. This advantageously allows the initial silicon nitride layer 17 to remain, so as to obtain the configuration illustrated in FIG. 5. A photoresist is then deposited on either side of the base, and a smaller amount of resin is deposited above the emitter, then $P^+$ implantation of the stack 8 is carried out with the aid of boron, so as to define the extrinsic base Be (FIG. 6). Next, after the transistor has been protected with the resin, implantation of arsenic is carried out so as to produce an N⁺ implanted zone referenced 600 on the surface of the collector well.

The final step includes producing the base, emitter and collector connection sockets S by a known technique of the self-aligned silicide type. This includes deposition of a layer of metal (for example, titanium) in order to form a silicide ($TiSi_2$) on the silicon zones of the extrinsic base, of the emitter and of the extrinsic collector. The $Si_3N_4$ layer is left over the entire wafer during the etching of the stack 8 is of considerable advantage during the siliciding phase. This is because, in a conventional siliciding phase, a protective silicon dioxide layer ("Si protect") is deposited and this layer is etched so as to leave silicon remaining only at the locations intended for the formation of $TiSi_2$. Other silicon zones on the wafer, which are not to receive titanium at this stage in the treatment, are therefore protected. However, during the subsequent etching of this protective layer, which is carried out over a predetermined etching time, a little of the underlying silicon dioxide is etched, in particular in the side insulation zones.

Furthermore, according to the invention, the initial layer 17 of $Si_3N_4$ serves as a stop for etching the protective layer which covers it, and therefore protects the side insulation regions. Of course, after siliciding, the initial layer 17 of $Si_3N_4$ is etched with a stop on the oxide of the side insulation regions.

A transistor according to the invention, as illustrated in FIG. 6, is therefore an n-p-n vertical bipolar transistor with a silicon-germanium heterojunction base which can be used in a BiCMOS technology of the VLSI type. The base rests partly on the initial layer 17 of silicon nitride and partly on that surface of the intrinsic collector which lies in the base window 170 formed in the initial layer 17 of silicon nitride. In this embodiment, it furthermore includes a monocrystalline emitter, directly in contact with the silicon of the base which is a convenient simplification because the emitter is directly in contact with the upper encapsulation layer 82 (because of dopant diffusion and various heat treatments, the emitter/base junction lies in the encapsulation layer 82). It has reduced low-frequency noise, while retaining good static parameters, in particular the current gain, because of the presence of the SiGe heterojunction which compensates for the loss of gain due to the absence of oxide at the interface between emitter and the stack 8.

It is also particularly advantageous, when the emitter doped in situ is being produced, to adjust the amount of dopant gas as the epitaxy of the emitter proceeds. Thus, at the start of the epitaxy, the arsine flow rate mentioned above (0.12 cm³/min) will, for example, be kept while, in the upper region of the emitter, this flow rate will be reduced, for example down to a value of 0.6 cm³/min. Therefore, for an emitter doped in situ, a concentration of As dopant equal, for example, to $3 \cdot 10^{20}/cm^3$ in the lower region of the emitter in contact with the base, and a concentration of As dopant equal, for example, to $10^{20}/cm^3$ in the upper region of the emitter will finally be obtained. These values therefore make it possible to obtain both good electron injection into the lower part of the emitter and good siliciding above the upper part of the emitter. The invention is nevertheless not limited to a vertical bipolar transistor having an epitaxial emitter. It is generally applicable to any type of vertical bipolar transistor, and in particular also to those having a polycrystalline emitter, in which the emitter results from the deposition of polysilicon which may be carried out in a conventional furnace, followed by doping, or else doped in situ in a chemical vapor deposition reactor and includes, in both cases, an oxide layer present at the emitter/base (emitter/stack 8) interface. The invention also applies to any type of epitaxial base, and in particular to those formed exclusively from silicon, for which the stack 8 is reduced to a single silicon layer.

That which is claimed is:

1. A vertical bipolar transistor comprising:

a semiconductor region;

an intrinsic collector on the semiconductor region, the intrinsic collector having an upper part;

a side insulation region on the upper part of the intrinsic collector;

a silicon nitride layer extending over the side insulation region and defining a window above a surface of the intrinsic collector; and an SiGe heterojunction base including an epitaxial stack of layers of silicon and silicon-germanium on the surface of the intrinsic collector in the window and on the silicon nitride layer, wherein the epitaxial stack of layers includes a first silicon layer, a silicon-germanium layer on the first silicon layer, and a second silicon layer on the silicon-germanium layer.

2. A vertical bipolar transistor according to claim 1 further comprising:

an extrinsic collector layer buried in the semiconductor region;

a collector well in contact with the extrinsic collector layer; and an emitter above the stack of layers.

3. A SiGe heterojunction base of a vertical bipolar transistor comprising a semiconductor region, an intrinsic collector on the semiconductor region, and a side insulation region on an upper part of the intrinsic collector, the SiGe heterojunction base comprising:

a silicon nitride layer extending over the side insulation region and defining a window above a surface of the intrinsic collector; and an epitaxial stack of layers of silicon and silicon-germanium on the surface of the intrinsic collector in the window and on the silicon nitride layer, wherein the epitaxial stack of layers includes a first silicon layer, a silicon-germanium layer on the first silicon layer, and a second silicon layer on the silicon-germanium layer.

* * * * *